(12) United States Patent
Chen

(10) Patent No.: US 11,579,649 B1
(45) Date of Patent: Feb. 14, 2023

(54) APPARATUS AND METHODS FOR CLOCK DUTY CYCLE CORRECTION AND DESKEW

(71) Applicant: Analog Devices, Inc., Wilmington, MA (US)

(72) Inventor: Wei-Hung Chen, Millburn, NJ (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/646,638

(22) Filed: Dec. 30, 2021

(51) Int. Cl.
*G06F 1/10* (2006.01)
*H03K 3/012* (2006.01)
*H03K 3/017* (2006.01)

(52) U.S. Cl.
CPC ............ *G06F 1/10* (2013.01); *H03K 3/012* (2013.01); *H03K 3/017* (2013.01)

(58) Field of Classification Search
CPC .......... H03F 3/45179; H03F 2200/165; G11C 7/222; H03M 1/66; H03B 5/1212; H04L 25/0272; H04L 7/0008; H04L 25/0278; H04L 25/028; H04L 25/14; H04L 25/0292; H03L 7/06; H03L 7/099; H03L 7/0812; H03L 7/00; H03L 7/0814; H03L 7/0891; G06F 1/10; G06F 1/04; H03K 5/135; H03K 3/012; H03K 5/01; H03K 5/13; H03K 3/0315
See application file for complete search history.

(56) References Cited

U.S. PATENT DOCUMENTS

| | | | |
|---|---|---|---|
| 6,667,647 B2 | 12/2003 | Magoshi | |
| 7,237,217 B2 | 6/2007 | Restle | |
| 7,679,416 B2 | 3/2010 | Cheng et al. | |
| 7,683,896 B2 | 3/2010 | Odryna et al. | |
| 8,179,173 B2 | 5/2012 | Hirata et al. | |
| 8,310,294 B2 | 11/2012 | Poulton et al. | |
| 8,571,513 B2 | 10/2013 | O'mahony et al. | |
| 9,041,451 B2 | 5/2015 | Papaefthymiou et al. | |
| 9,735,793 B2 * | 8/2017 | Cheng Chang | G06F 1/10 |

(Continued)

FOREIGN PATENT DOCUMENTS

| | | |
|---|---|---|
| EP | 3829066 A1 | 6/2021 |
| WO | WO2014024263 A1 | 2/2014 |

OTHER PUBLICATIONS

Frans et al., "A 40-to-64 GB/s NRZ Transmitter With Supply-Regulated Front-End in 16 nm FinFET" Journal of Solid-State Circuits, vol. 51, No. 12, Dec. 2016 in 11 pages.

(Continued)

*Primary Examiner* — John W Poos
(74) *Attorney, Agent, or Firm* — Knobbe, Martens, Olson & Bear, LLP

(57) ABSTRACT

Apparatus and methods for clock duty cycle correction and deskew are provided. In certain embodiments, a clock distribution circuit includes a clock driver that provides a differential clock signal to a clock slicer over a pair of transmission lines. The clock distribution circuit further includes a resistor-inductor-capacitor (RLC) tuning circuit for providing termination between the pair of transmission lines and a differential input to the clock slicer. The RLC tuning circuit includes a pair of resistor digital-to-analog converters (resistor DACs or RDACs) coupled to the pair of transmission lines and a pair of controllable inductor-capacitor (LC) circuits coupled to the pair of transmission lines.

20 Claims, 14 Drawing Sheets

(56) References Cited

U.S. PATENT DOCUMENTS

| | | |
|---|---|---|
| 9,794,055 B2 | 10/2017 | Chen |
| 10,224,905 B1 * | 3/2019 | Lin .................. H03K 3/356104 |
| 10,698,441 B2 | 6/2020 | Cali et al. |
| 11,269,371 B1 * | 3/2022 | Elabd .................... H04L 7/0008 |
| 2004/0057330 A1 | 3/2004 | Wu |
| 2008/0197903 A1 | 8/2008 | Humble |
| 2016/0191062 A1 * | 6/2016 | Shivaram .................. H03L 7/10 |
| | | 327/144 |
| 2019/0212770 A1 | 7/2019 | Hashempour et al. |
| 2020/0409407 A1 | 12/2020 | Wong et al. |

OTHER PUBLICATIONS

Lee et al., "An Adaptive Low-Jitter LC-Based Clock Distribution" 2007 IEEE International Solid-State Circuits Conference dated Feb. 13, 2007 in 3 pages.

Menolfi et al.," A 112Gb/s 2.6pJ/b 8-Tap FFE PAM-4 SSTTX in 14nm CMOS" 2018 IEEE International Solid-State Circuits Conference dated Feb. 12, 2018 in 3 pages.

Talegaonkar et al., "An 8 GB/s-64 Mb/s, 2.3-4.2 mW/GB/s Burst-Mode Transmitter in 90 nm CMOS" IEEE Journal of Solid-State Circuits, vol. 49, No. 10, Oct. 2014 in 15 pages.

* cited by examiner

APPARATUS AND METHODS FOR CLOCK DUTY CYCLE CORRECTION AND DESKEW

FIELD OF THE DISCLOSURE

Embodiments of the invention relate to electronics, and more particularly, to electronic circuits for distributing clock signals.

BACKGROUND

Clock distribution circuits are used in a wide variety of applications to distribute a clock signal across a semiconductor die.

For example, a semiconductor die or chip can include various circuits that operate based on timing of a clock signal and that are spread out over the chip. For instance, various analog, digital, and/or mixed-signal circuits can be positioned across different parts of the chip and operate in response to timing of the clock signal, and the clock distribution circuit can serve to deliver the clock signal to these circuits. It is desirable for a clock distribution circuit to distribute the clock signal with low power dissipation, low noise, and/or other performance parameters.

SUMMARY OF THE DISCLOSURE

Apparatus and methods for clock duty cycle correction and deskew are provided. In certain embodiments, a clock distribution circuit includes a clock driver that provides a differential clock signal to a clock slicer over a pair of transmission lines. The clock distribution circuit further includes a resistor-inductor-capacitor (RLC) tuning circuit for providing termination between the pair of transmission lines and a differential input to the clock slicer. The RLC tuning circuit includes a pair of resistor digital-to-analog converters (resistor DACs or RDACs) coupled to the pair of transmission lines and a pair of controllable inductor-capacitor (LC) circuits coupled to the pair of transmission lines.

In one aspect, a clock distribution circuit includes a clock slicer having a differential input, a pair of transmission lines including a first transmission line and a second transmission line, a clock driver configured to provide a differential clock signal to the differential input of the clock slicer over the pair of transmission lines, and a resistor-inductor-capacitor (RLC) tuning circuit configured to provide termination to the differential input of the clock slicer. The RLC tuning circuit includes a first resistor digital-to-analog converter (RDAC) coupled to the first transmission line, a second RDAC coupled to the second transmission line, a first controllable LC circuit coupled to the first transmission line, and a second controllable LC circuit coupled to the second transmission line.

In another aspect, a method of clock signal distribution is provided. The method includes providing a differential clock signal to a differential input of a clock slicer over a pair of transmission lines including a first transmission line and a second transmission line, providing a duty cycle correction to the differential clock signal at the input of the clock slicer by controlling a first resistor digital-to-analog converter (RDAC) coupled to the first transmission line and a second RDAC coupled to the second transmission line, and providing a deskew correction to the differential clock signal at the input of the clock slicer by controlling a first controllable LC circuit coupled to the first transmission line and a second controllable LC circuit coupled to the second transmission line.

In another aspect, a semiconductor die includes a clock distribution circuit including a clock slicer having a differential input, a pair of transmission lines including a first transmission line and a second transmission line, a clock driver configured to provide a differential clock signal to the differential input of the clock slicer over the pair of transmission lines, and a resistor-inductor-capacitor (RLC) tuning circuit configured to provide termination to the differential input of the clock slicer, the RLC tuning circuit including a first resistor digital-to-analog converter (RDAC) coupled to the first transmission line, a second RDAC coupled to the second transmission line, a first controllable LC circuit coupled to the first transmission line, and a second controllable LC circuit coupled to the second transmission line. The semiconductor die further includes a core circuit having timing controlled by an output clock signal from the clock slicer.

DETAILED DESCRIPTION OF EMBODIMENTS

Figure 1:
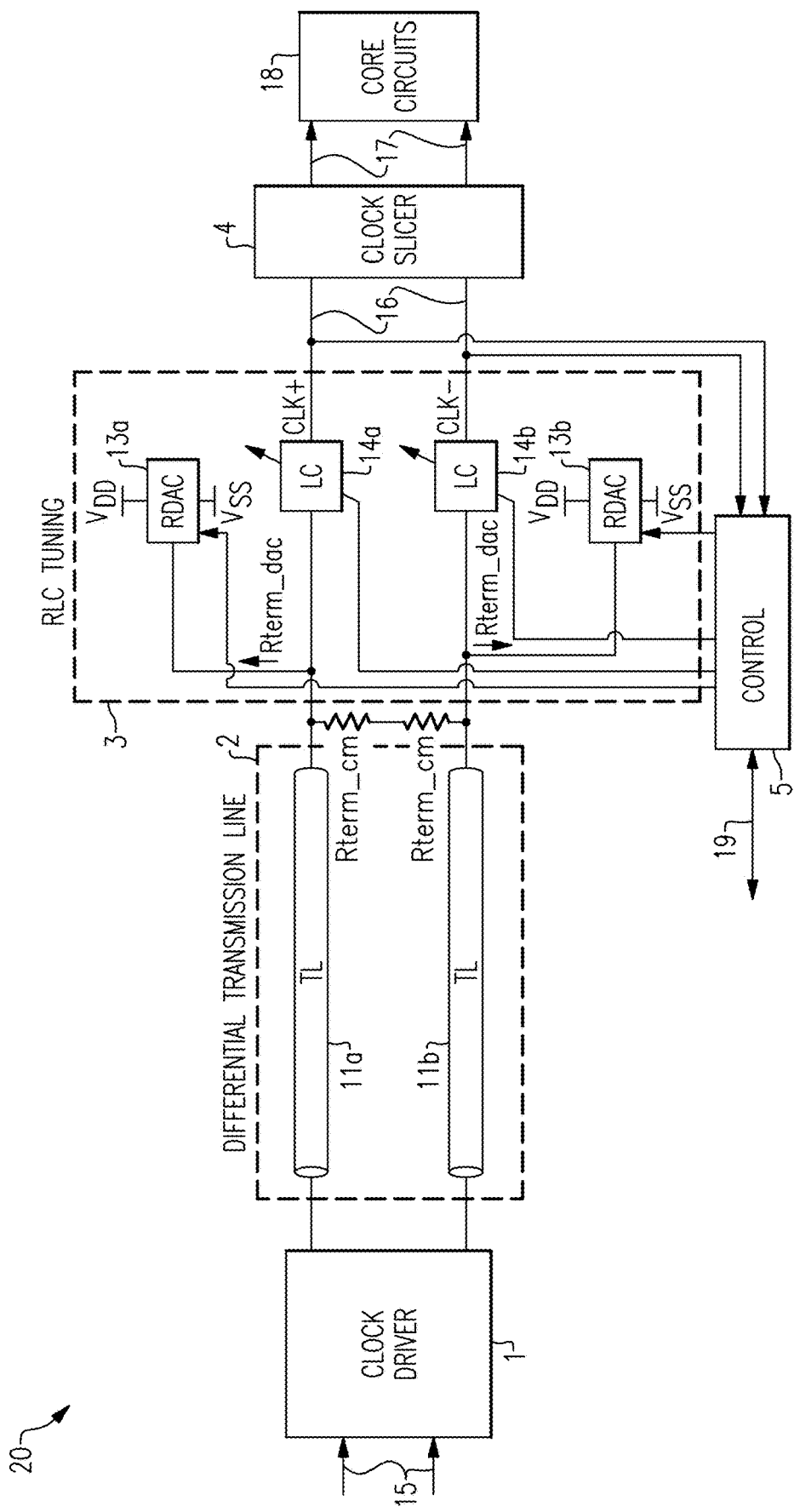
FIG. 1 is a schematic diagram of a clock distribution circuit with clock correction according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Clock distribution circuits can be used to distribute a clock signal across a semiconductor chip. To enhance immunity to common-mode noise sources, the clock signal can be distributed as a differential clock signal including a non-inverted signal component and an inverted signal component. However, even when using differential signaling, a number of clock signal errors can be present. Absent compensation, the clock signal errors can degrade performance of core circuitry that operates based on timing of the clock signal.

Duty cycle, skew between non-inverted and inverted clock signal components (p/n-skew), and/or jitter are examples of important clock signal parameters for on-chip global clock distribution. For high performance applications, tight requirements for these clock signal parameters can be specified for a particular clock signal frequency. In one example, a clock distribution circuit for distributing a 20 GHz differential clock signal across a semiconductor chip is specified to operate with a very low clock jitter of 10 fs or less with less than +/−1 ps duty cycle error and +/−1 ps p/n-skew.

Certain duty cycle correction (DCC) and p/n deskew circuits adjust a clock buffer's switching timing by varying the clock slew rate. However, such correction schemes suffer from high jitter as the slew rate starts to decrease at high correction level. Other types of correction circuits are unable to provide both DCC and p/n deskew and/or cause degradation to other performance parameters such as phase noise.

Apparatus and methods for clock duty cycle correction and deskew are provided. In certain embodiments, a clock distribution circuit includes a clock driver that provides a differential clock signal to a clock slicer over a pair of transmission lines. The clock distribution circuit further includes a resistor-inductor-capacitor (RLC) tuning circuit for providing termination between the pair of transmission lines and a differential input to the clock slicer. The RLC tuning circuit includes a pair of resistor digital-to-analog converters (resistor DACs or RDACs) coupled to the pair of transmission lines and a pair of controllable inductor-capacitor (LC) circuits coupled to the pair of transmission lines.

The RLC tuning circuit uses the pair of RDACs to DC-shift the clock waveform up and down at the differential input to the clock slicer. For example, each RDAC can present a particular termination resistance to a corresponding one of the transmission lines, but a proportion of the termination resistance connected to a power high supply voltage (herein $V_{DD}$) relative to a power low supply voltage (herein $V_{SS}$ or GND) can be controlled using the RDACs to DC-shift the voltage level of the clock waveform at the clock slicer's differential input.

Furthermore, deskew can be provided by passing the clock signal through the controllable LC circuits. For example, each controllable LC circuit can include a series LC tuner of variable group delay set by way of a capacitor DAC (CDAC).

The RLC tuning circuits herein can provide robust duty cycle correction and deskew. Moreover, in the frequency domain the underlying controllable LC delay mechanism for deskew is orthogonal to the DC principle of the RDACs used for deskew. By providing orthogonality between duty cycle correction and deskew, firmware development is simplified by addressing one correction at a time without interfering with the results of the previous correction. A well-defined correction granularity is therefore ensured. Furthermore, a broadly low jitter is achieved (insensitive to residual timing impairments after duty cycle correction and p/n-deskew) due to the amplitude boost and broadband noise suppression of the LC resonance.

FIG. 1 is a schematic diagram of a clock distribution circuit 20 with clock correction according to one embodiment. The clock distribution circuit 20 includes a clock driver 1, a pair of transmission lines 2 (also referred to herein as a differential transmission line), an RLC tuning circuit 3, a clock slicer 4, a control circuit 5, and a pair of termination resistors Rterm_cm.

As shown in FIG. 1, the clock driver 1 receives a differential input clock signal 15, and provides a differential clock signal 16 to the clock slicer 4 over the pair of transmission lines 2. Additionally, the clock slicer 4 outputs a differential local clock signal 17 that can be used by one or more core circuits 18 that have timing controlled by the clock distribution circuit 20.

The clock distribution circuit 20 can be used to provide clock signal distribution over long distances of a semiconductor chip. For example, in certain implementations the differential transmission line 2 has a length of 1 mm or more. Although a single RLC tuning circuit 3 and clock slicer 4 is shown, multiple RLC tuning circuits and clock slicers can be included along the pair of transmission lines 2 and/or multiple pairs of transmission lines can be provided for aiding distribution.

As shown in FIG. 1, the pair of transmission lines 2 includes a first transmission line (TL) 11a for providing a non-inverted clock signal CLK+ from a non-inverted output of the clock driver 1 to a non-inverted input of the clock slicer 4, and a second transmission line 11b for providing an inverted clock signal CLK− from an inverted output of the clock driver 1 to an inverted input of the clock slicer 4.

The RLC tuning circuit 3 includes a first resistor DAC 13a, a second resistor DAC 13b, a first controllable LC circuit 14a, and a second controllable LC circuit 14b, each of which are controlled by the control circuit 5.

The first resistor DAC 13a and the second resistor DAC 13b each have multiple settings associated with the same input resistance—Rterm_dac. However, for each of the settings a proportion of Rterm_dac that is connected to a power high supply voltage $V_{DD}$ relative to a power low supply voltage $V_{SS}$ changes. By changing the settings of the resistor DACs 13a/13b, the resistor DAC output voltage at the CLK+/CLK− nodes changes. The clock waveforms CLK+/CLK− therefore shift up and down accordingly. The level-shifted waveforms pass through the clock slicer 4, which operates applies a fixed threshold for slicing and causes the output duty cycle of the clock waveforms 17 to change based on the shifted DC voltage level. [0038] Each input resistance Rterm_dac provides a single-ended termination resistance to CLK+ and CLK−, respectively, to reduce or minimize waveform reflection on the transmission line. By keeping the Rterm_dac value substantially constant and independent of duty cycle correction settings, the waveform at CLK+ and CLK− is shifted up or down but the shape is largely unchanged. This improves the duty cycle correction linearity as the waveform gets sliced.

Although the input resistance Rterm_dac can be constant across settings of the resistors DACs 13a/13b, the value of the input resistance Rterm_dac can itself be tuned or otherwise compensated to achieve a desired amount of termination resistance for good input impedance matching. For example, the input resistance Rterm_dac can be tuned to account for process, voltage, and/or temperature (PVT) variation.

With continuing reference to FIG. 1, the settings or codes of the resistor DACs 13a/13b can be chosen by the control circuit 5 to apply duty cycle correction (DCC) that achieves about 50% duty cycle for the differential clock signal 17. In certain implementations, the control circuit 5 receives the differential clock signal 17 and detects the duty cycle to aid in choosing a particular setting.

The control circuit 5 also sets the capacitance and/or inductance value(s) of the first controllable LC circuit 14a and the second controllable LC circuit 14b, which correspond to series LC tuners, in this embodiment. The controllable LC circuits 14a/14b provide a variable group delay to provide deskew. In certain implementations, the controllable LC circuits 14a/14b each include a capacitor DAC for providing capacitance adjustment.

The RLC tuning circuit 3 provides robust duty cycle correction and deskew. Additionally, the duty cycle correction provided by the resistor DACs 13a/13b is orthogonal in the frequency domain to the deskew correction provided by the controllable LC circuits 14a/14b. Accordingly, choosing suitable settings or values for correcting clock errors is simplified and well-defined correction granularity is ensured. Moreover, a broadly low jitter is achieved (insensitive to residual timing impairments after duty cycle correction and p/n-deskew) due to the amplitude boost and broadband noise suppression of the LC resonance.

In the illustrated embodiment, the control circuit 5 can be programmed using an interface 19, which corresponds to an interface or bus of a semiconductor chip on which the clock distribution circuit 20 is fabricated. Thus, an end-user has flexibility for programming the control circuit 5 to achieve suitable clock correction and/or to read settings used for providing correction.

Figure 2A:
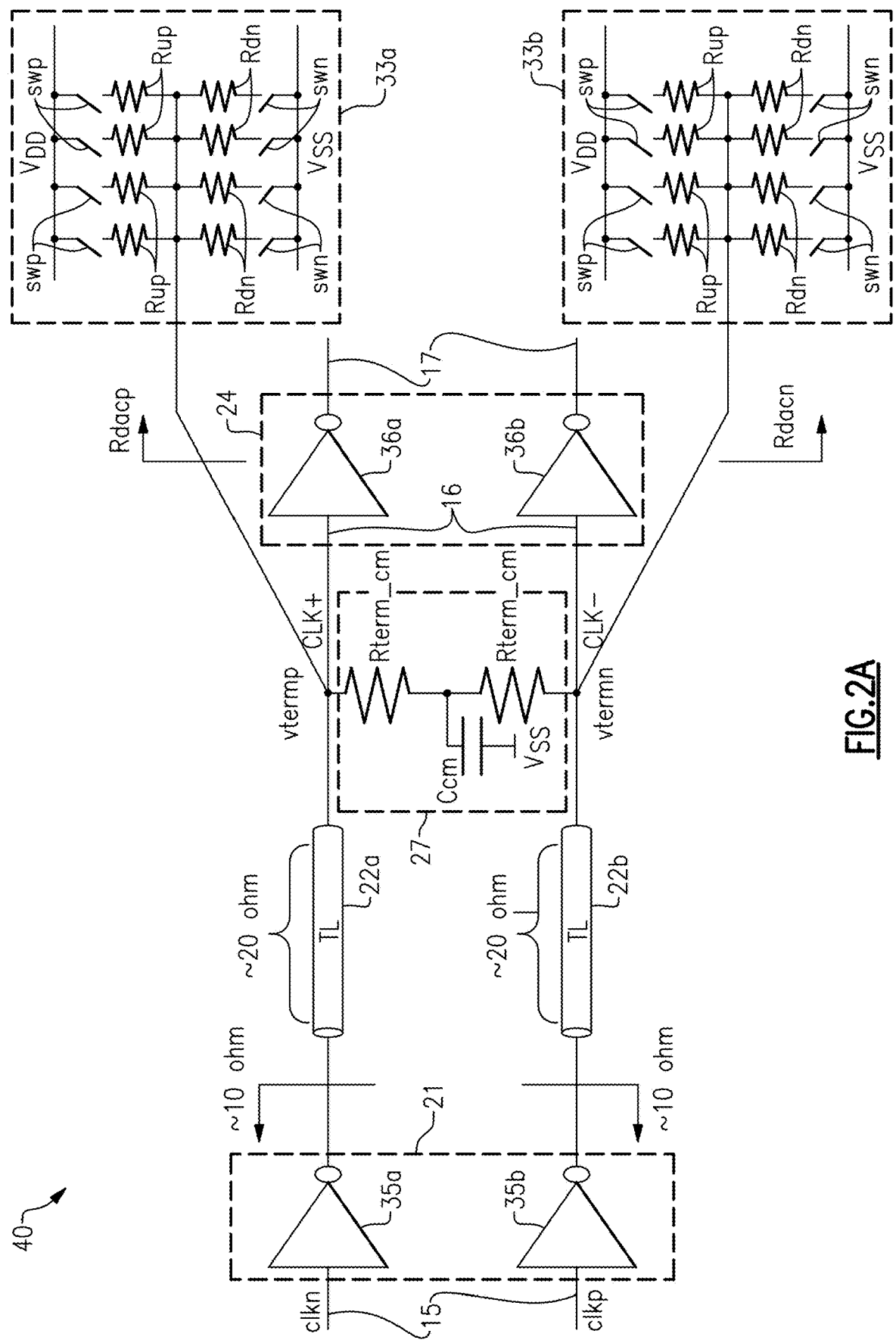
FIG. 2A is a schematic diagram of a clock distribution circuit with clock correction according to another embodiment.
Figure 2B:
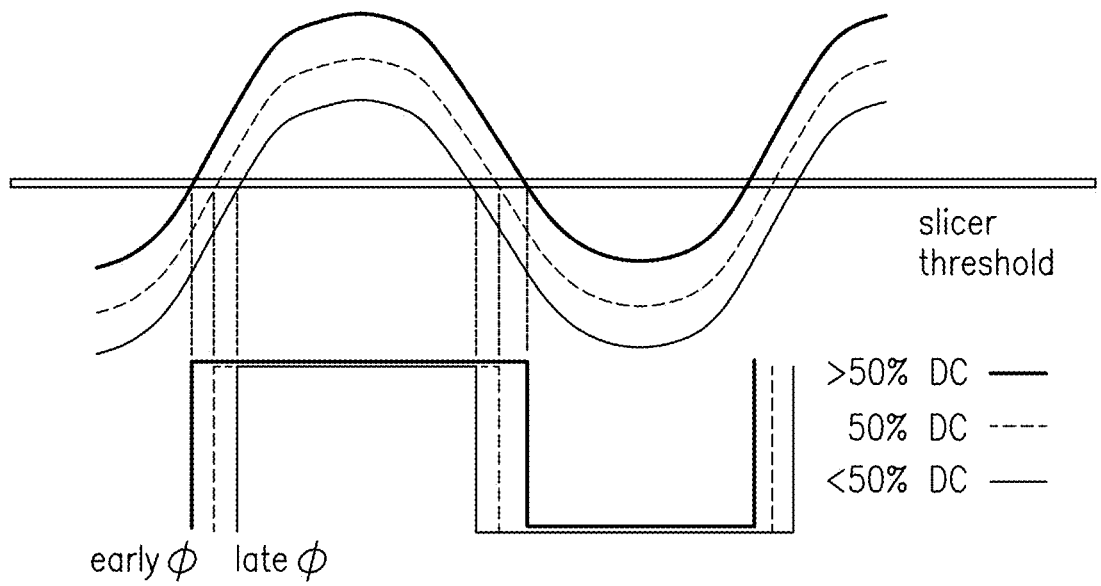
FIG. 2B is a schematic diagram of one example of a graph of controllable duty cycle correction for the clock distribution circuit of FIG. 2A.

FIG. 2A is a schematic diagram of a clock distribution circuit 40 with clock correction according to another embodiment. FIG. 2B is a schematic diagram of one example of a graph of controllable duty cycle correction for the clock distribution circuit 40 of FIG. 2A.

The clock distribution circuit 40 includes a clock driver 21 (10Ω output impedance, in this example), a first transmission line 22a (20Ω, in this example), a second transmission line 22b (20Ω, in this example), a clock slicer 24, a common-mode termination circuit 27, a first resistor DAC 33a, and a second resistor DAC 33b.

The first resistor DAC 33a and the second resistor DAC 33b illustrate embodiments of resistors DACs that can be included as part of an RLC tuning circuit used for clock correction in accordance with the teachings herein. For clarity of the figure, details related to LC tuning are not shown in FIG. 2A. However, any of the LC tuning schemes herein can be included in the clock distribution circuit 40.

In the illustrated embodiment, the clock driver 21 includes a first driver inverter 35a and a second driver inverter 35b, while the clock slicer 24 includes a first slicer inverter 36a and a second slicer inverter 36b. An input of the first driver inverter 35a receives an inverted input clock signal clkn, while an output of the first driver inverter 35a is coupled to an input of the first slicer inverter 36a through the first transmission line 22a. Additionally, an input of the second driver inverter 35b receives a non-inverted input clock signal clkp, while an output of the second driver inverter 35b is coupled to an input of the second slicer inverter 36b through the second transmission line 22b.

As shown in FIG. 2A, the common-mode termination circuit 27 includes a pair of termination resistors Rterm_cm that are connected in series between the input of the first slicer inverter 36a and the input of the second slicer inverter 36b. Additionally, a common-mode capacitor Ccm is connected in shunt between an intermediate node of the termination resistors Rterm_cm and $V_{SS}$. Including the termination resistors Rterm_cm in the cross path across the differential input to clock slicer 24 reduces driver current and eases electro migration. Furthermore, including the common-mode bypass capacitor Ccm aids in keeping the common-mode s-parameter s11 low.

The first resistor DAC 33a includes a bank of up resistors Rup each connectable to $V_{DD}$ by a corresponding up switch swp. Additionally, the first resistor DAC 33a further includes a bank of down resistors Rdn each connectable to $V_{SS}$ by a corresponding down switch swn. The second resistor DAC 33b includes a similar set of components as the first resistor DAC 33a.

As shown in FIG. 2A, the input to the first slicer inverter 36a is annotated with a voltage vtermp, while the input to the second slicer inverter 36b is annotated with a voltage vtermn. Additionally, an input resistance to the first resistor DAC 33a is annotated with an input resistance Rdacp, while an input resistance to the second resistor DAC 33b is annotated with an input resistance Rdacn.

By changing the settings of the first resistor DAC 33a and the second resistor DAC 33b, the input resistances Rdacp and Rdacn remain substantially constant, but the DC voltage levels of vtermp and vtermn can be shifted up or down. Thus, complementary codes for swp and swn are used to keep the DAC resistance constant (each branch always connected to either $V_{DD}$ or $V_{SS}$). Thus, the transmission line termination resistance remains constant. In one example, Rterm_dac in parallel with Rterm_cm is chosen to be about 100Ω, where Rdac is the input resistance to the resistor DACs 33a/33b (Rterm_dac=Rdacp=Rdacn).

As shown in FIG. 2B, by changing the resistor DAC settings, different amounts of duty cycle correction can be provided to the differential clock signal 16 present at the input to the clock slicer 24.

Figure 3:
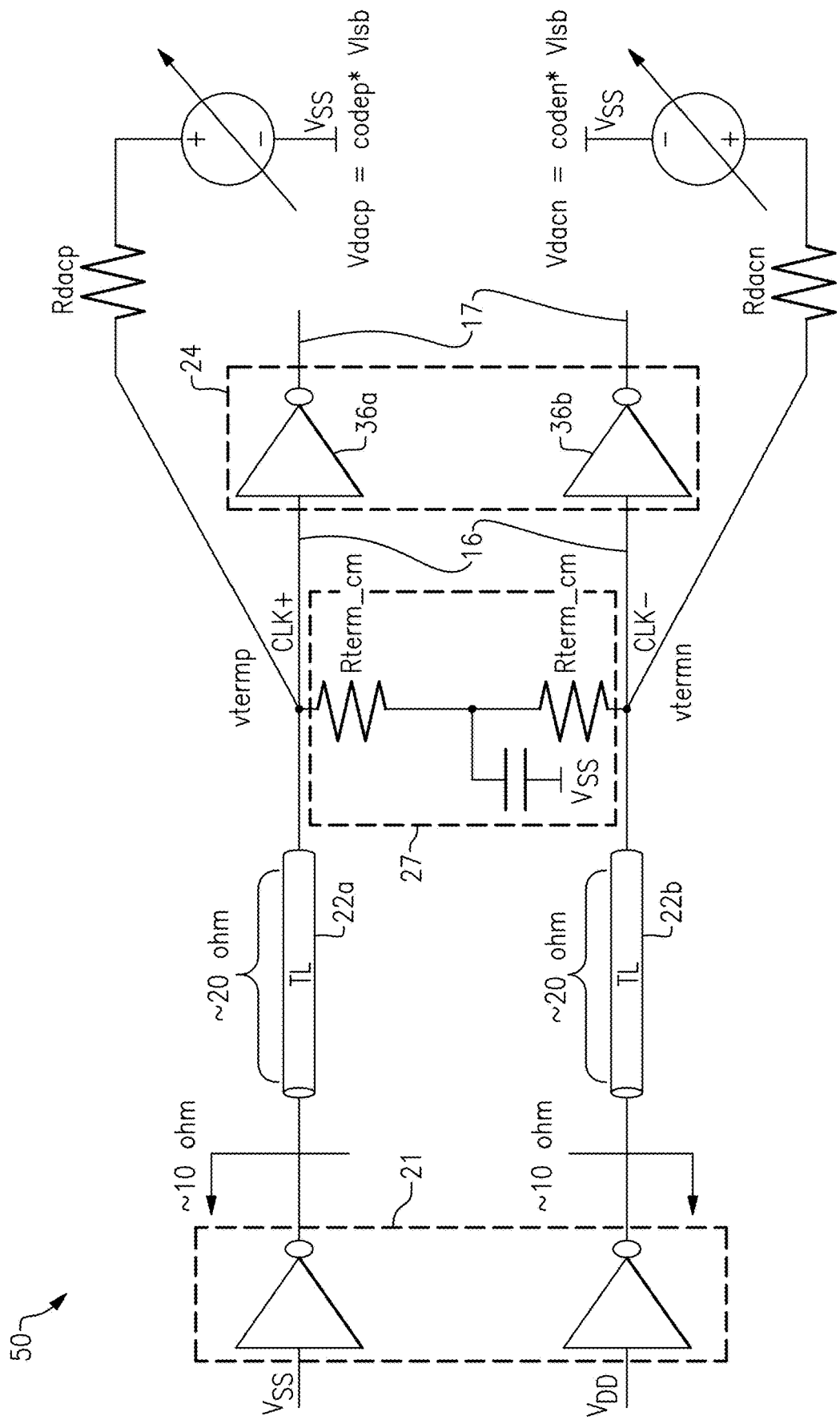
FIG. 3 is a schematic diagram of one example of a Thevenin network analysis for the clock distribution circuit of FIG. 2A.

FIG. 3 is a schematic diagram of one example of a Thevenin network analysis 50 for the clock distribution circuit 40 of FIG. 2A.

As shown in FIG. 3, the first resistor DAC 33a of FIG. 2A is represented by a first controllable voltage source Vdacp in series with a fixed resistor Rdacp. Additionally, the second resistor DAC 33b of FIG. 2A is represented by a second controllable voltage source Vdacn in series with a fixed resistor Rdacn. The first controllable voltage source Vdacp is controlled by codep*Vlsb, where codep is the first RDAC control code and Vlsb is the least signification bit (LSB)

voltage. Additionally, the second controllable voltage source Vdacn is controlled by coden*Vlsb, where coden is the second RDAC control code.

In this example, vtermp and vtermn are approximated by Equation 1 and Equation 2 below.

$$V_{termp} \cong$$  Equation 1

$$\frac{(Rdrv + RTL + 2 \times R_{term\_cm}) // Rdacp}{Rdrv + RTL + (Rdrv + RTL + 2 \times R_{term\_cm}) // Rdacp} \times V_{dd} +$$

$$\frac{Rdrv + RTL}{Rdrv + RTL + R_{dacp}} \times V_{dacp}$$

$$V_{termn} \cong \frac{(Rdrv + RTL + 2 \times R_{term\_cm}) // Rdacp}{Rdrv + RTL + (Rdrv + RTL + 2 \times R_{term\_cm}) // Rdacp} \times$$ Equation 2

$$V_{dd} \times \frac{(Rdrv + RTL)}{Rdrv + RTL + 2 \times R_{term\_cm}} + \frac{Rdrv + RTL}{Rdrv + RTL + R_{dacp}} \times V_{dacp}$$

Figure 4:
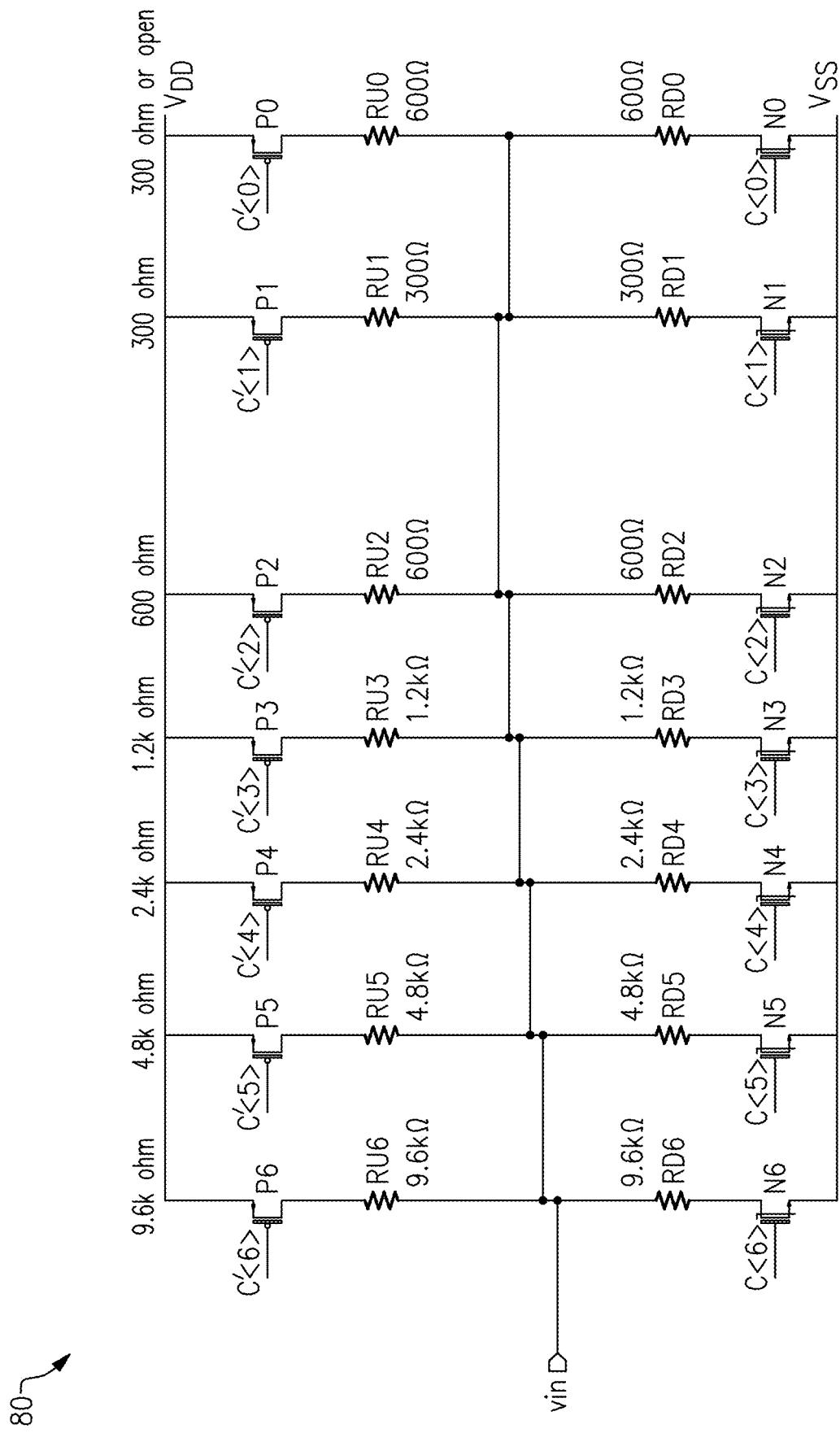
FIG. 4 is a schematic diagram of a resistor digital-to-analog converter (RDAC) according to one embodiment.

With reference to FIG. 3, minimal RDAC cross-contamination is provided as long as RTL+ Rdrv<<any of Rterm_cm, Rdacp and Rdacn, which can be satisfied by choosing suitable resistor values. Additionally, duty cycle correction (DCC) range and resolution can be set by resistor values in the above expressions. Furthermore, the clock distribution circuit achieves low phase noise due to the mostly passive resistor network and simple inverter chain. Moreover, very broad band operation is achieved by placing the switches between the resistors and Vdd/$V_{SS}$ in each of the DAC branches to decouple their loading from the actual termination nodes FIG. 4 is a schematic diagram of an RDAC 80 according to one embodiment. The RDAC 80 includes a switch-controlled up resistor bank and a switch-controlled down resistor bank. In particular, the RDAC 80 includes an n-type field effect transistor (NFET) N0, an NFET N1, an NFET N2, an NFET N3, an NFET N4, an NFET N5, an NFET N6, a p-type field effect transistor (PFET) P0, a PFET P1, a PFET P2, a PFET P3, a PFET P4, a PFET P5, a PFET P6, a down resistor RD0, a down resistor RD1, a down resistor RD2, a down resistor RD3, a down resistor RD4, a down resistor RD5, a down resistor RD6, an up resistor RU0, an up resistor RU1, an up resistor RU2, an up resistor RU3, an up resistor RU4, an up resistor RU5, and an up resistor RU6.

As shown in FIG. 4, the down resistors RD0-RD6 are each connected in series with a corresponding one of the NFETs N0-N6 between an input node yin and $V_{SS}$. Additionally, the up resistors RU0-RU6 are each connected in series with a corresponding one of the PFETs P0-P6 between the input node yin and $V_{DD}$. Additionally, an RDAC control code including control bits C<0>, C<1>, C<2>, C<3>, C<4>, C<5>, and C<6> (collectively C<6:0>) to the NFETs N0-N6 and C'<0>, C'<1>, C'<2>, C'<3>, C'<4>, C'<5>, and C'<6> (collectively C'<6:0>) are provided to the PFETs P0-P6, respectively to control connectivity of the down resistors RD0-RD6 and the up resistors RU0-RU6 to $V_{SS}$ and $V_{DD}$.

In the illustrated embodiment, the resistance looking into the input node yin is constant for each value of the RDAC control code C<6:0>. However, the proportion of resistance connected to $V_{SS}$ relative to $V_{DD}$ changes based on the setting of the RDAC control code C<6:0>.

The down resistors RD0-RD6 and the up resistors RU0-RU6 can have any suitable weighting scheme. In this example, RD0 and RU0 are 600Ω, RD1 and RU1 are 300Ω, RD2 and RU2 are 600Ω, RD3 and RU3 are 1.2 kΩ, RD4 and RU4 are 2.4 kΩ, RD5 and RU5 are 4.8 kΩ, and RD6 and RU6 are 9.6 kΩ. Thus, in this embodiment, the RDAC 80 includes a binary-weighted 5-bit resistor array (controlled by C<6:2> and C'<6:2>) that is in parallel with a binary weighted 2-bit resistor array (controlled by C<1:0> and C'<1:0>). As an example of configuring the 5+2 bit DAC, the ohm value labelled on the top of each branch represents the respective branch input resistance (looking in from node yin) during the course of duty cycle correction if the same code is applied to {C<6:2>, C'<6:2>} and {C<1>, C'<1>}, and different value is applied to {C<0>, C'<0>}. However, other resistance values, array sizes, and/or weighting schemes can be used.

Figure 5A:
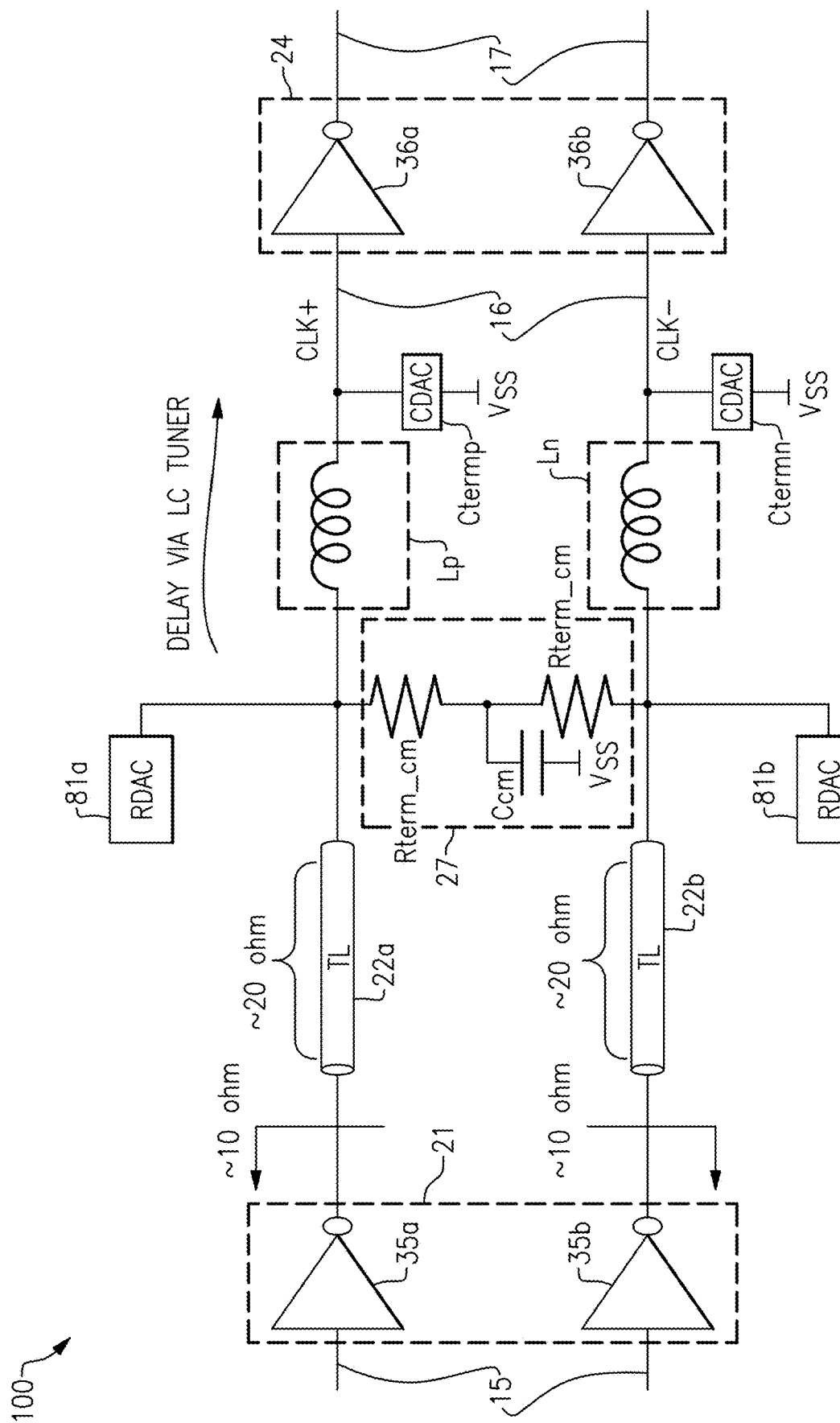
FIG. 5A is a schematic diagram of a clock distribution circuit with clock correction according to another embodiment.
Figure 5B:
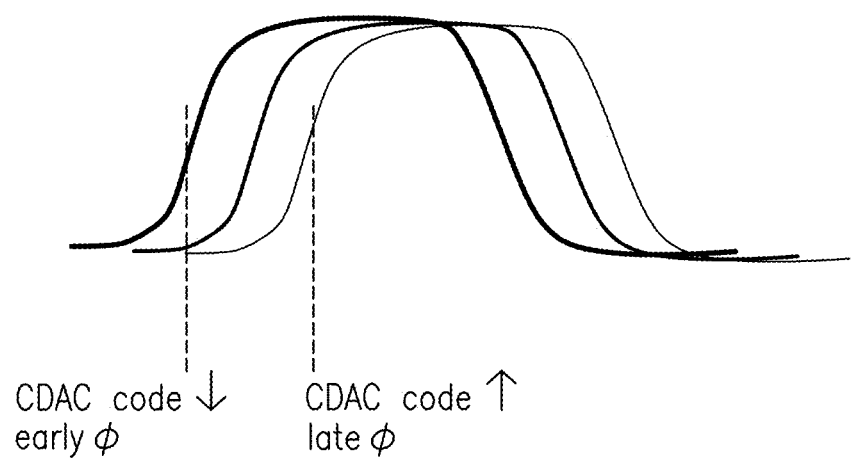
FIG. 5B is a schematic diagram of one example of a graph of controllable phase delay for the clock distribution circuit of FIG. 5A.

FIG. 5A is a schematic diagram of a clock distribution circuit 100 with clock correction according to another embodiment. FIG. 5B is a schematic diagram of one example of a graph of controllable phase delay for the clock distribution circuit 100 of FIG. 5A.

The clock distribution circuit 100 includes a clock driver 21 (10Ω output impedance, in this example), a first transmission line 22a (20Ω, in this example), a second transmission line 22b (20Ω, in this example), a clock slicer 24, a common-mode termination circuit 27, a first resistor DAC 81a, a second resistor DAC 81b, a first inductor Lp, a second inductor Ln, a first capacitor DAC (CDAC) Ctermp, and a second CDAC Ctermn.

In the illustrated embodiment, a controllable LC tank is included at the non-inverted input to the clock slicer 24 and at the inverted input to the clock slicer 24. In this embodiment, each LC tank includes a series inductor and a shunt capacitor DAC. Additionally, the series LC tanks are each positioned between a corresponding RDAC and input to the clock slicer 24.

The settings of the RDACs 81a/81b can be controlled to provide waveform DC shift to achieve duty cycle correction through the slicer. The phase of the clock signal changes based on the settings of the CDACs Ctermp/Ctermn due to the variable group delay of the LC tank. Besides the adjusted duty cycle, the edge delay at the slicer output can advance or postpone depending on RDAC's upward or downward DC shift, therefore incurring a p/n-skew between two independent RDAC settings. Accordingly, DCC-incurred skew is present and should be absorbed into the CDAC range.

In the illustrated embodiment, the LC tanks provide noise filtering and clock amplification at the output of the tanks. The value of the quality-factor (Q) can be selected to achieve desired operating frequency range (for instance, Q can be lowered to widen frequency range).

Figure 6:
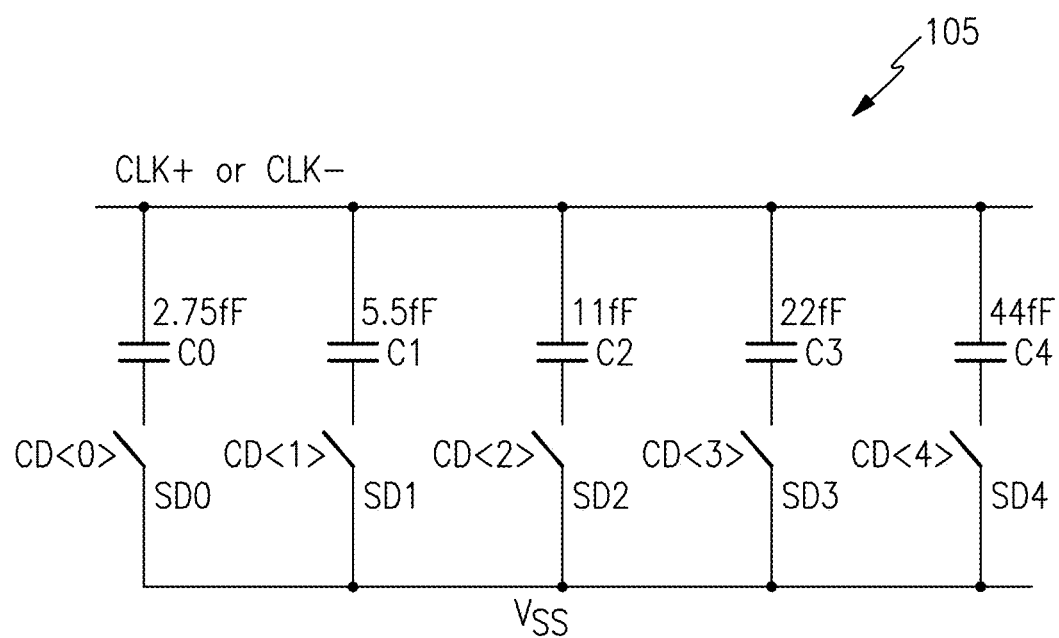
FIG. 6 is a schematic diagram of a capacitor digital-to-analog converter (CDAC) according to one embodiment.

FIG. 6 is a schematic diagram of a capacitor digital-to-analog converter (CDAC) 105 according to one embodiment. The CDAC 105 includes a switch-controlled capacitor bank including switches SD0, SD1, SD2, SD3, and SD4, and capacitors C0, C1, C2, C3, and C4.

As shown in FIG. 6, the capacitors C0-C4 are each connected in series with a corresponding one of the switches SD0-SD4 between an input node (which can be coupled to CLK+ or CLK−) and $V_{SS}$. Additionally, a CDAC control code including control bits CD<0>, CD<1>, CD<2>, CD<3>, and CD<4> (collectively CD<4:0>) is provided to the switches SD0-SD4 to control connectivity of the capacitors C0-C4 to $V_{SS}$.

In the illustrated embodiment, the capacitance looking into the input node changes for each value of the CDAC control code CD<4:0>.

The capacitors C0-C4 can have any suitable weighting scheme. In this example, C0 is 2.75fF, C1 is 5.5fF, C2 is 11fF, C3 is 22fF, and C4 is 44fF, and thus a binary weighting scheme is used. However, other capacitance values, weighting schemes, and/or array sizes are possible.

Figure 7:
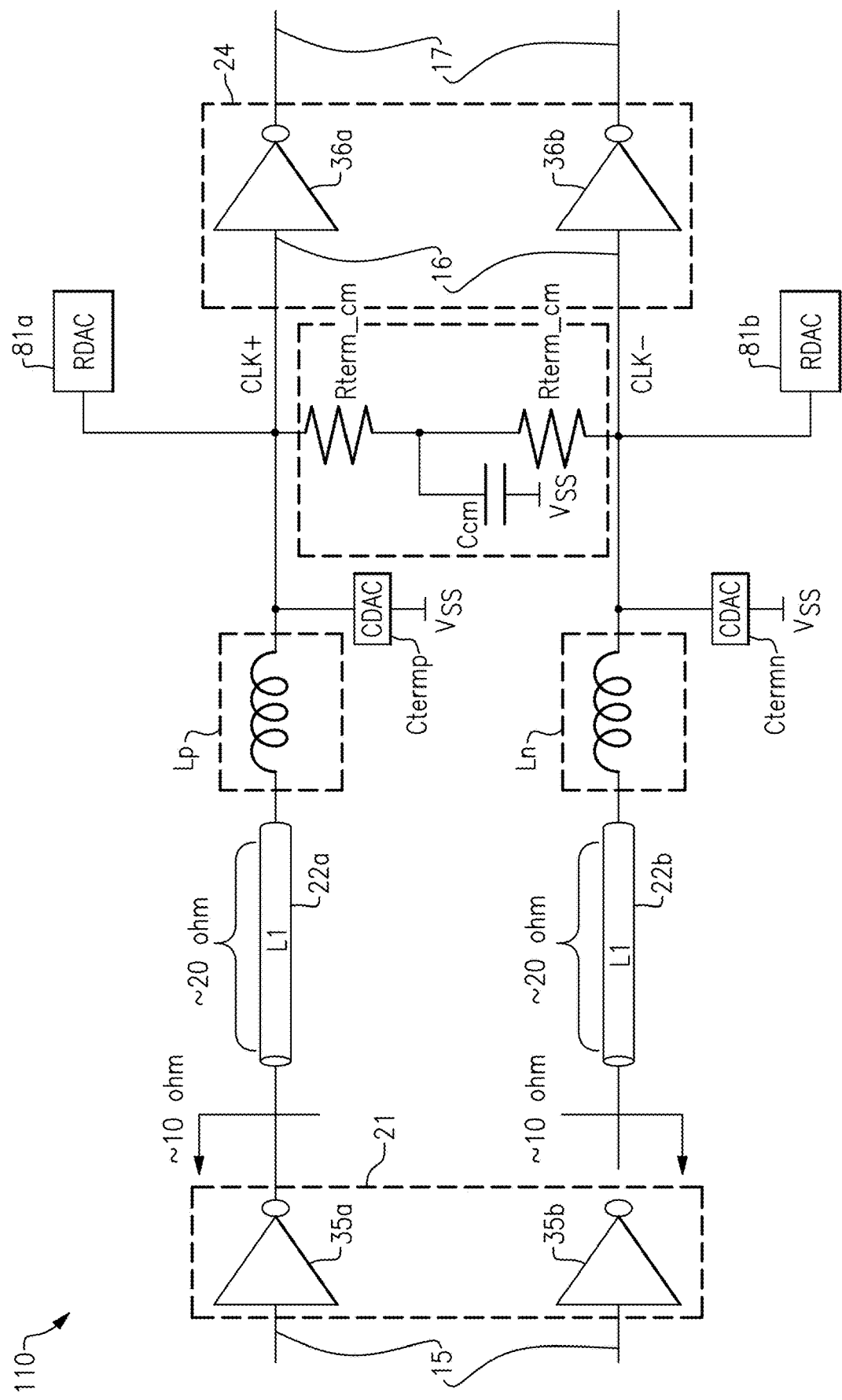
FIG. 7 is a schematic diagram of a clock distribution circuit with clock correction according to another embodiment.

FIG. 7 is a schematic diagram of a clock distribution circuit 110 with clock correction according to another embodiment.

The clock distribution circuit 110 includes a clock driver 21 (10$\Omega$ output impedance, in this example), a first transmission line 22a (20$\Omega$, in this example), a second transmission line 22b (20$\Omega$, in this example), a clock slicer 24, a common-mode termination circuit 27, a first resistor DAC 81a, a second resistor DAC 81b, a first inductor Lp, a second inductor Ln, a first capacitor DAC (CDAC) Ctermp, and a second CDAC Ctermn.

The clock distribution circuit 110 of FIG. 7 is similar to the clock distribution circuit 100 of FIG. 5A except that the order of the RDACs and LC tuners is reversed. Thus, in FIG. 7, the first RDAC 81a is positioned between the first inductor LP and a non-inverted input to the clock slicer 24, and the second RDAC 81b is positioned between the second inductor Ln and an inverted input to the clock slicer 24.

Figure 8:
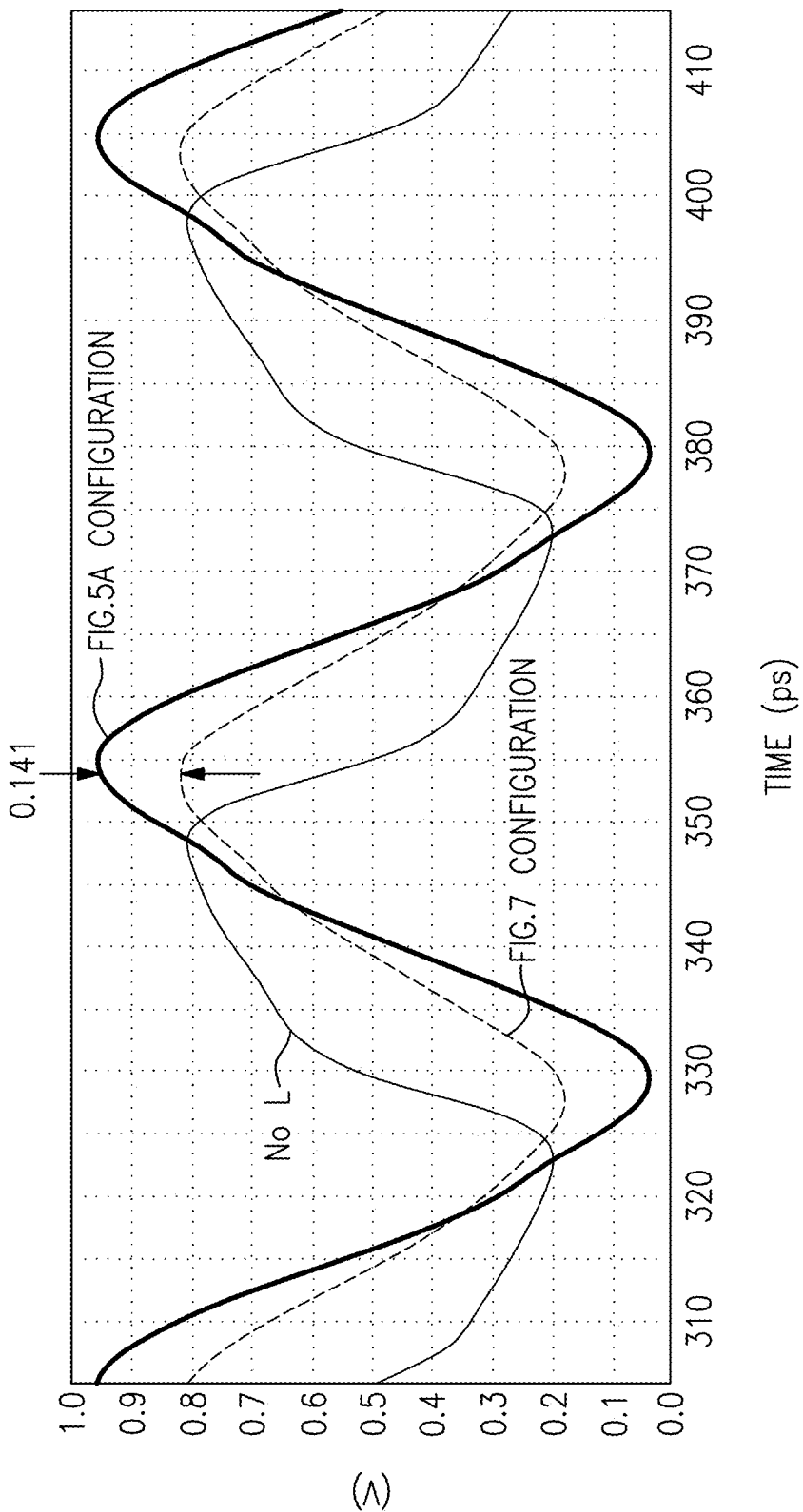
FIG. 8 is a graph of voltage versus time clock waveforms for various clock correction schemes.

FIG. 8 is a graph of voltage versus time clock waveforms for various clock correction schemes.

Clock waveforms are depicted for one implementation of FIG. 5A, for one implementation of FIG. 7, and for one implementation in which no inductor is included (but with RDACs and CDACs both kept). As shown in FIG. 8, the highest performance is obtained using the configuration of FIG. 5A in which the inductors are positioned after the RDACs. For example, positioning the inductors in this manner can provide improved clock signal amplitude.

Figure 9:
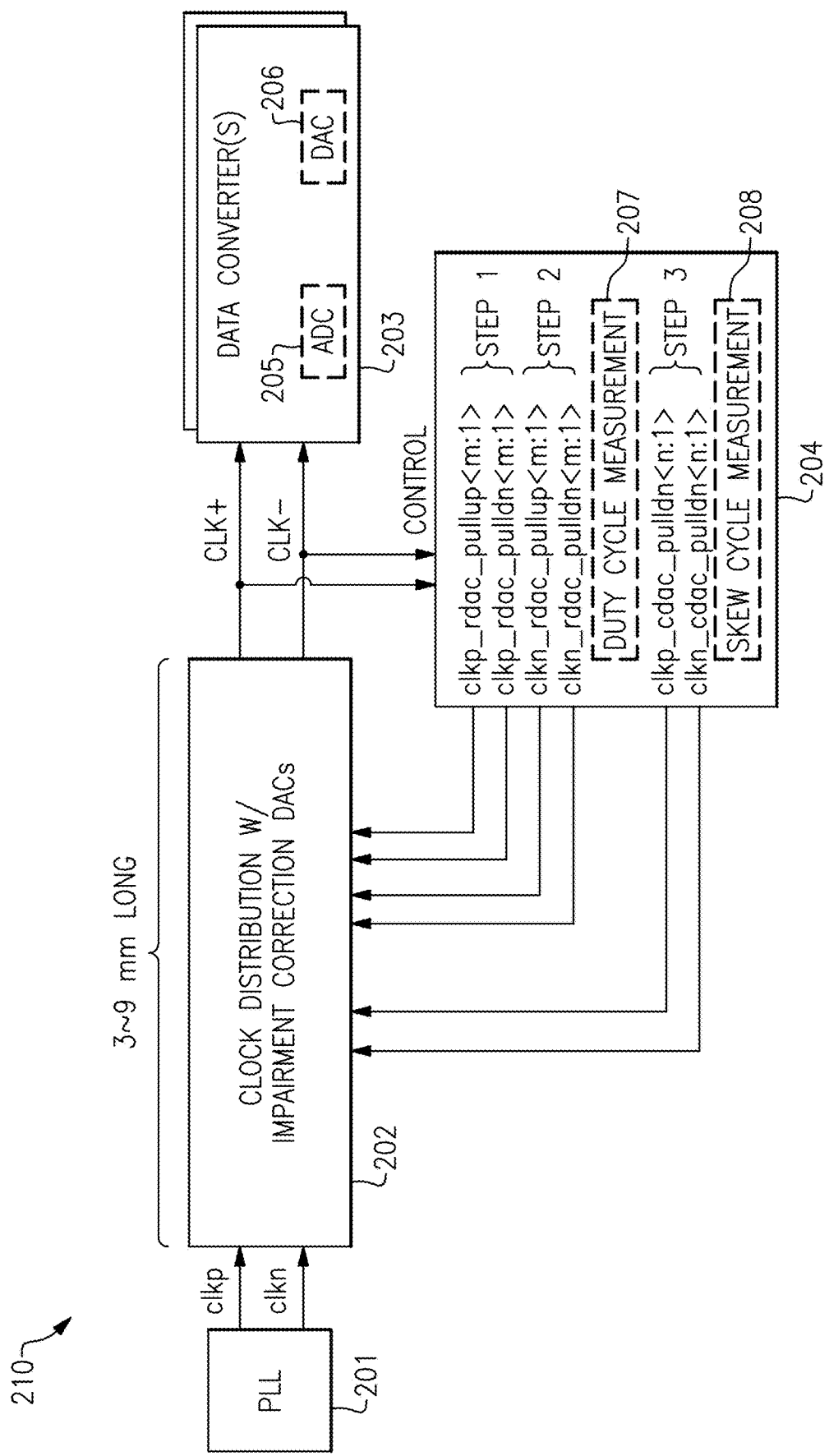
FIG. 9 is a schematic diagram of a semiconductor die with clock correction according to one embodiment.

FIG. 9 is a schematic diagram of a semiconductor die 210 with clock correction according to another embodiment. The semiconductor die 210 includes a phase-locked loop (PLL) 201, a clock distribution circuit 202, a data converters 203, and a control circuit 204.

In the illustrated embodiment, the PLL 201 generates a differential input clock signal that includes a non-inverted component clkp and an inverted component clkn. Additionally, the clock distribution circuit 202 distributes the differential clock signal across the semiconductor die 210 over a long distance (for example, over a length of 3 mm to 9 mm, in this embodiment). The clock distribution circuit 202 can be implemented in accordance with any of the embodiments herein.

As shown in FIG. 9, the clock distribution circuit 202 delivers a differential clock signal CLK+/CLK− to the data converters 203, which include one or more analog-to-digital converters (ADCs) 205 and/or one or more digital-to-analog converters (DACs) 206.

The control circuit 204 includes a duty cycle measurement circuit 207 and a skew measurement circuit 208 for measuring the differential clock signal's duty cycle and skew, respectively. The control circuit 204 also provides various RDAC and CDAC control codes for controlling the correction DACs within the clock distribution circuit 202.

In the illustrated embodiment, the control circuit 204 generates four RDAC codes including clkp_rdac_pullup<m:1> for controlling the pull-up resistance of the CLK+ RDAC, clkp_rdac_pulldn<m:1> for controlling the pull-down resistance of the CLK+ RDAC, clkn_rdac_pullup<m:1> for controlling the pull-up resistance of the CLK− RDAC, and clkp_rdac_pulldn<m:1> for controlling the pull-down resistance of the CLK+ RDAC. Additionally, the control circuit 204 generates two CDAC codes including clkp_cdac_pulldown<n:0> for controlling the CLK+ CDAC and clkn_cdac_pulldown<n:0> for controlling the CLK− CDAC.

In certain implementations, the control circuit 204 selects values for the control codes in three phases or steps. In particular, in a first step, the control circuit 204 sets a value of the RDAC pull-up and pull-down resistance for one of clkp or clkn, and then in a second step sets a value of the RDAC pull-up and pull-down resistance for the other of clkp or clkn. The control circuit 204 uses observations from the duty cycle measurement circuit 207 to achieve suitable values for the RDAC codes. Furthermore, in a third step, the control circuit 204 sets a value of the CDAC pull-down capacitances for clkp and clkn. The control circuit 204 uses observations from the skew cycle measurement circuit 208 to achieve suitable values for the CDAC codes.

Thus, DCC is performed before p/n deskew. Implementing the correction algorithm in this manner avoids introducing a new DCC-incurred skew error if the p/n deskew were to be conducted first and followed by a DCC calibration for the reasons discussed earlier.

FIGS. 10A-11C are simulations of one implementation of the clock correction circuit 100 of FIG. 5A when operating at a 20 GHz clock signal frequency.

Figure 10A:
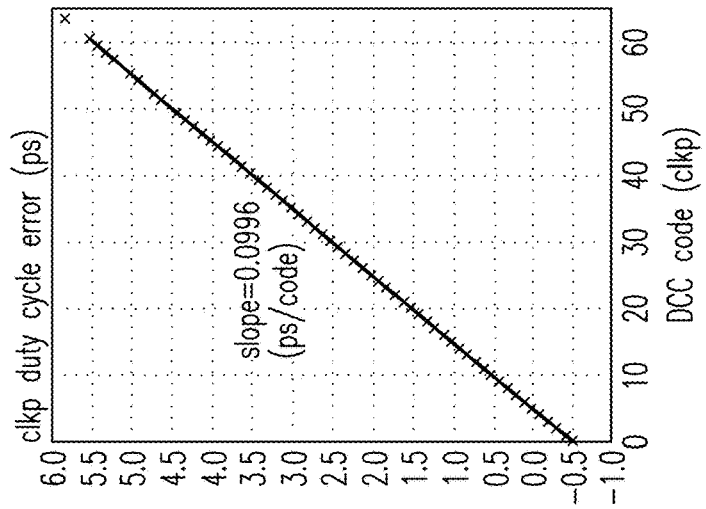
FIG. 10A is graph of one example of non-inverted clock signal (clkp) duty cycle error versus clkp duty cycle correction (DCC) code.

FIG. 10A is graph of one example of clkp duty cycle error versus clkp DCC code. As shown in FIG. 10A, a max change of about 6 ps on clkp duty cycle occurs over the DCC code range.

Figure 10B:
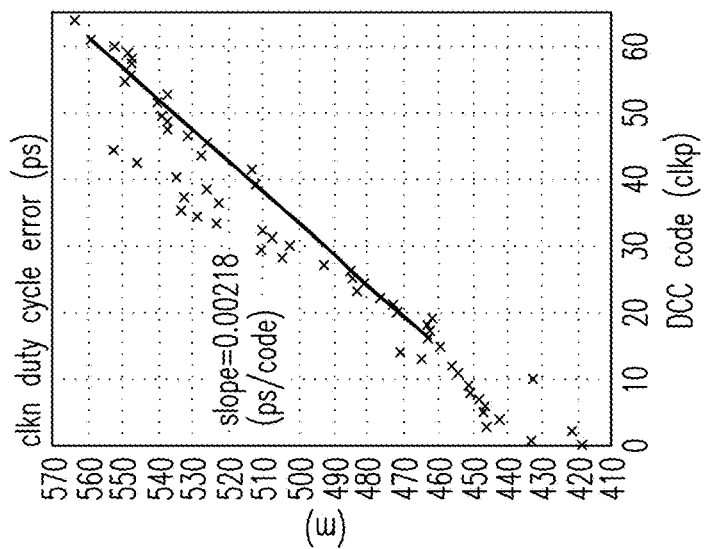
FIG. 10B is graph of one example of inverted clock signal (clkn) duty cycle error versus clkp DCC code.

FIG. 10B is graph of one example of clkn duty cycle error versus clkp DCC code. As shown in FIG. 10B, the change in clkn duty cycle error with respect to clkp DCC code is negligible.

Figure 10C:
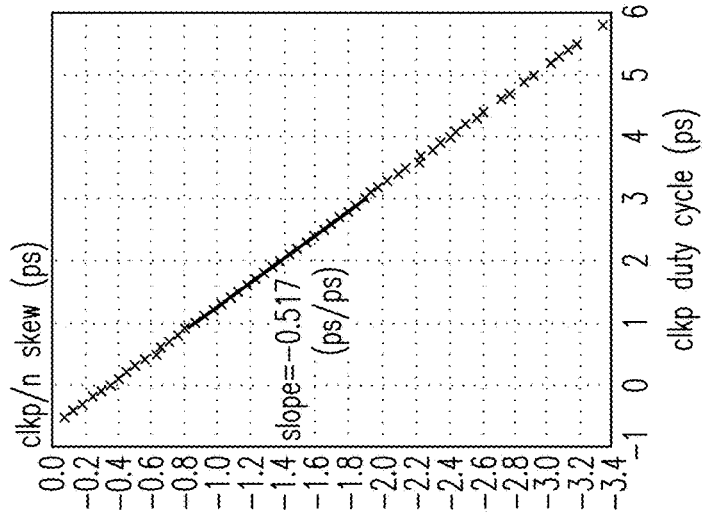
FIG. 10C is a graph of one example of deskew versus clkp duty cycle.

FIG. 10C is a graph of one example of deskew versus clkp duty cycle. The graph depicts a clkp/clkn skew caused by changes in the code of the clkp RDAC.

Figure 11C:
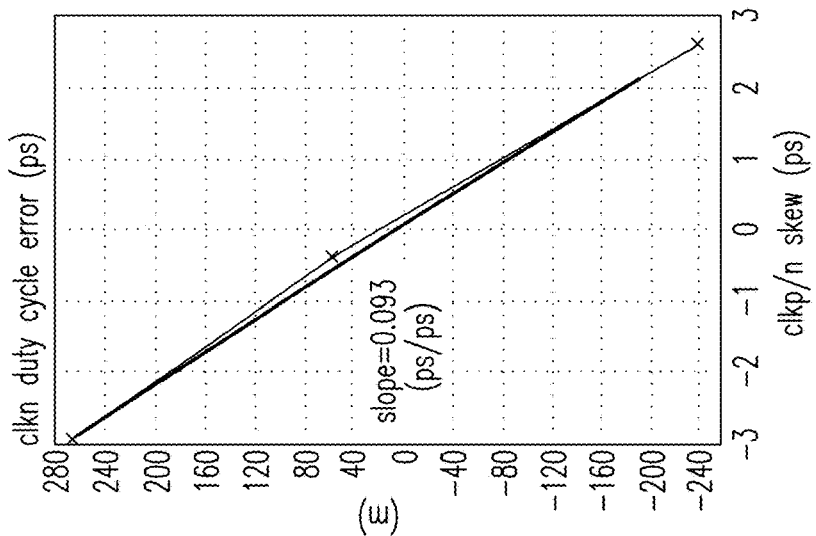
FIG. 11C is a graph of one example of clkn duty cycle error versus deskew.
Figure 11B:
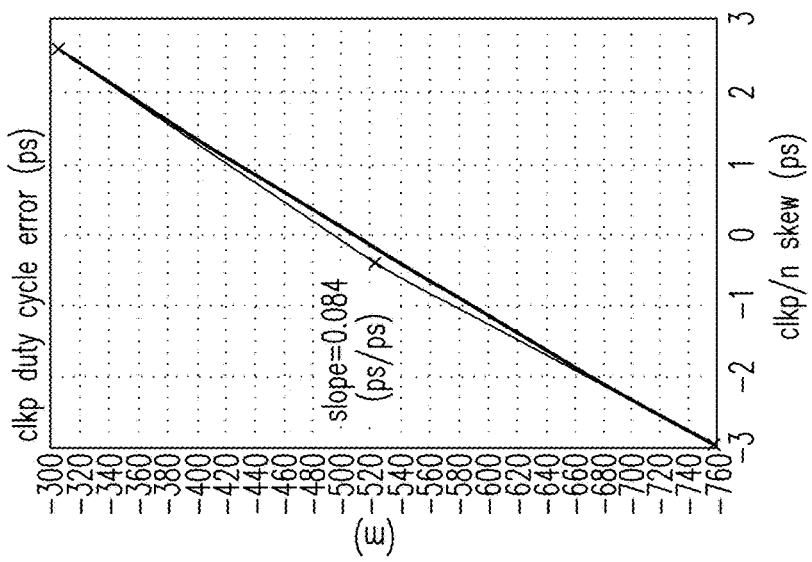
FIG. 11B is a graph of one example of clkp duty cycle error versus deskew.
Figure 11A:
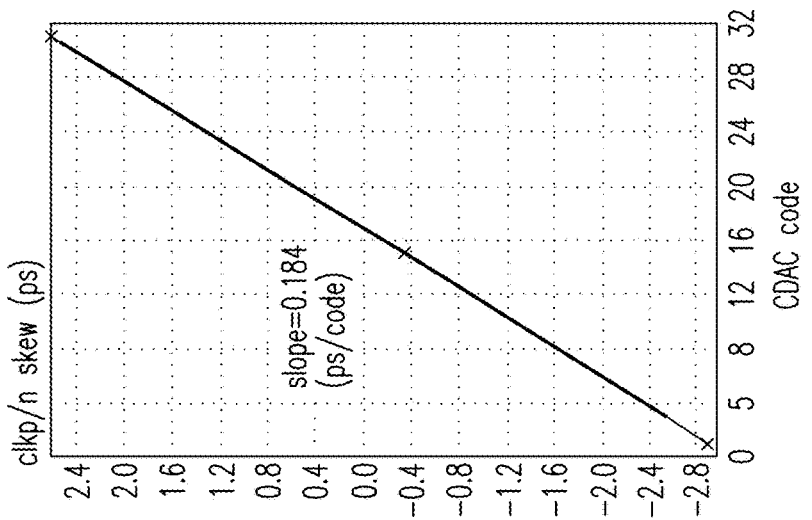
FIG. 11A is a graph of one example of deskew versus capacitor digital-to-analog converter (CDAC) code.

FIG. 11A is a graph of one example of deskew versus CDAC code. A max change of about 5.5 ps skew occurs over the CDAC code range.

FIG. 11B is a graph of one example of clkp duty cycle error versus deskew. As shown in FIG. 11B, the change in clkp duty cycle with respect to skew is negligible.

FIG. 11C is a graph of one example of clkn duty cycle error versus deskew. As shown in FIG. 11C, the change in clkn duty cycle with respect to skew is negligible.

Figure 12A:
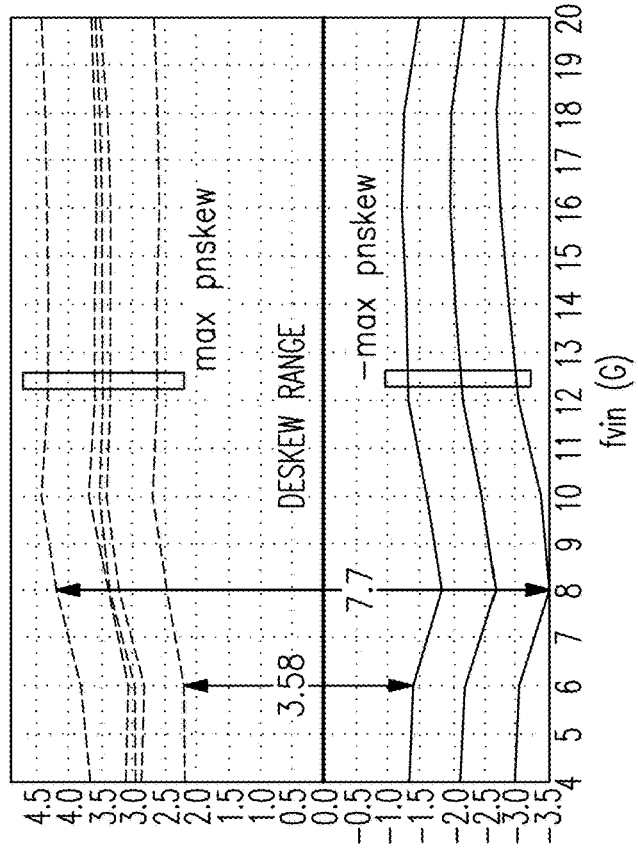
FIG. 12A is a graph of one example of DCC versus input clock signal frequency.

FIG. 12A is a graph of one example of DCC versus input clock signal frequency. The graph includes plots for various process, voltage, and temperature (PVT) conditions for a minimum RDAC code (top lines) versus a maximum RDAC code (bottom lines). The difference between a top line and a corresponding bottom line indicates the DCC range.

Figure 12B:
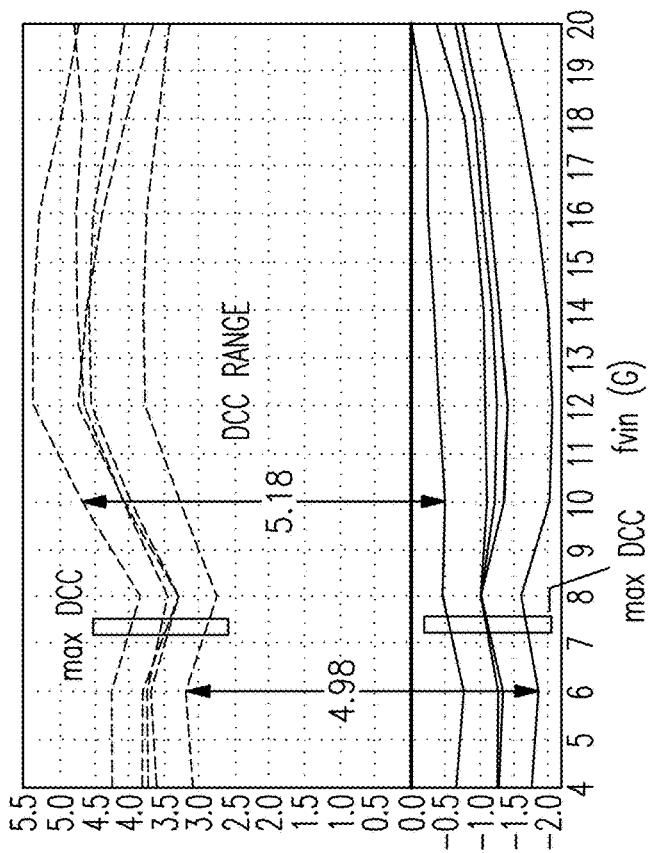
FIG. 12B is a graph of one example of deskew versus input clock signal frequency.

FIG. 12B is a graph of one example of deskew versus input clock signal frequency. The graph includes plots for various PVT conditions for a minimum CDAC code (top lines) versus a maximum CDAC code (bottom lines). The difference between a top line and a corresponding bottom line indicates the deskew range.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A clock distribution circuit comprising:
   a clock slicer having a differential input;
   a pair of transmission lines including a first transmission line and a second transmission line;
   a clock driver configured to provide a differential clock signal to the differential input of the clock slicer over the pair of transmission lines; and
   a resistor-inductor-capacitor (RLC) tuning circuit configured to provide termination to the differential input of the clock slicer, the RLC tuning circuit including a first resistor digital-to-analog converter (RDAC) coupled to the first transmission line, a second RDAC coupled to the second transmission line, a first controllable LC circuit coupled to the first transmission line, and a second controllable LC circuit coupled to the second transmission line.

2. The clock distribution circuit of claim 1 wherein a first control code of the first RDAC and a second control code of the second RDAC shift a DC voltage level of the differential clock signal at the differential input to the clock slicer.

3. The clock distribution circuit of claim 1 wherein an input resistance of the first RDAC is fixed across a plurality of settings, and wherein a proportion of the input resistance connected to a power high supply voltage relative to a power low supply voltage changes across the plurality of settings.

4. The clock distribution circuit of claim 3 wherein the first RDAC includes a first switch-controlled resistor bank connected between an input of the first RDAC and the power high supply voltage, and a second switch-controlled resistor bank connected between the input of the first RDAC and the power low supply voltage.

5. The clock distribution circuit of claim 1 wherein the first controllable LC circuit includes a series inductor between the first transmission line and the clock slicer, and a capacitor digital-to-analog converter (CDAC) connected between the first transmission line and a power low supply voltage.

6. The clock distribution circuit of claim 1 wherein a setting of the first controllable LC circuit controls an amount of deskew applied between a non-inverted component of the differential clock signal and an inverted component of the differential clock signal.

7. The clock distribution circuit of claim 1 wherein the first controllable LC circuit is positioned between the first transmission line and the clock slicer, and the second controllable LC circuit is positioned between the second transmission line and the clock slicer.

8. The clock distribution circuit of claim 1 further comprising a control circuit configured to set a first resistance code of the first RDAC, a second resistance code of the second RDAC, a first capacitance code of the first controllable LC circuit, and a second capacitance code of the second controllable LC circuit.

9. The clock distribution circuit of claim 8 wherein the control circuit is configured to set the first resistance code of the first RDAC and the second resistance code of the second RDAC to provide a clock duty cycle correction to the differential clock signal, and thereafter to set the first capacitance code of the first controllable LC circuit and a second capacitance code of the second controllable LC circuit to provide a deskew correction to the differential clock signal.

10. The clock distribution circuit of claim 1 further comprising a common-mode termination circuit including a first termination resistor and a second termination resistor connected in series between the first transmission line and the second transmission line, and a common-mode capacitor connected in shunt from a node between the first termination resistor and the second termination resistor to a power low supply voltage.

11. A method of clock signal distribution, the method comprising:
    providing a differential clock signal to a differential input of a clock slicer over a pair of transmission lines including a first transmission line and a second transmission line;
    providing a duty cycle correction to the differential clock signal at the input of the clock slicer by controlling a first resistor digital-to-analog converter (RDAC) coupled to the first transmission line and a second RDAC coupled to the second transmission line; and
    providing a deskew correction to the differential clock signal at the input of the clock slicer by controlling a first controllable LC circuit coupled to the first transmission line and a second controllable LC circuit coupled to the second transmission line.

12. The method of claim 11 wherein providing the duty cycle correction includes shifting a DC voltage level of the differential clock signal at the differential input to the clock slicer.

13. The method of claim 12 wherein an input resistance of the first RDAC is fixed across a plurality of settings, and wherein the method further comprises changing a proportion of the input resistance connected to a power high supply voltage relative to a power low supply voltage across the plurality of settings.

14. A semiconductor die comprising:
    a clock distribution circuit comprising:
      a clock slicer having a differential input;
      a pair of transmission lines including a first transmission line and a second transmission line;
      a clock driver configured to provide a differential clock signal to the differential input of the clock slicer over the pair of transmission lines; and
      a resistor-inductor-capacitor (RLC) tuning circuit configured to provide termination to the differential input of the clock slicer, the RLC tuning circuit including a first resistor digital-to-analog converter (RDAC) coupled to the first transmission line, a second RDAC coupled to the second transmission line, a first controllable LC circuit coupled to the first transmission line, and a second controllable LC circuit coupled to the second transmission line; and a core circuit having timing controlled by an output clock signal from the clock slicer.

15. The semiconductor die of claim 14 wherein the core circuit includes at least one of an analog-to-digital converter or a digital-to-analog converter.

16. The semiconductor die of claim 14 wherein a first control code of the first RDAC and a second control code of the second RDAC shift a DC voltage level of the differential clock signal at the differential input to the clock slicer.

17. The semiconductor die of claim 14 wherein an input resistance of the first RDAC is fixed across a plurality of settings, and wherein a proportion of the input resistance connected to a power high supply voltage relative to a power low supply voltage changes across the plurality of settings.

18. The semiconductor die of claim 14 wherein the first controllable LC circuit includes a series inductor between the first transmission line and the clock slicer, and a capacitor digital-to-analog converter (CDAC) connected between the first transmission line and a power low supply voltage.

19. The semiconductor die of claim 14 wherein a setting of the first controllable LC circuit controls an amount of deskew applied between a non-inverted component of the differential clock signal and an inverted component of the differential clock signal.

20. The semiconductor die of claim 14 wherein the control circuit is configured to set the first resistance code of the first RDAC and the second resistance code of the second RDAC to provide a clock duty cycle correction to the differential clock signal, and thereafter to set the first capacitance code of the first controllable LC circuit and a second capacitance code of the second controllable LC circuit to provide a deskew correction to the differential clock signal.

* * * * *